United States Patent
Wang et al.

(10) Patent No.: US 11,484,099 B2
(45) Date of Patent: Nov. 1, 2022

(54) FASTENING DEVICE

(71) Applicant: FIVETECH TECHNOLOGY INC., New Taipei (TW)

(72) Inventors: Ting-Jui Wang, New Taipei (TW); Wei-Chen Huang, New Taipei (TW); Yuan-Mu Lu, New Taipei (TW)

(73) Assignee: FIVETECH TECHNOLOGY INC., New Taipei (TW)

( * ) Notice: Subject to any disclaimer, the term of this patent is extended or adjusted under 35 U.S.C. 154(b) by 0 days.

(21) Appl. No.: 17/403,901

(22) Filed: Aug. 17, 2021

(65) Prior Publication Data

US 2022/0071357 A1    Mar. 10, 2022

(30) Foreign Application Priority Data

Sep. 7, 2020   (TW) .................................. 109130605

(51) Int. Cl.
*A44B 19/36*   (2006.01)

(52) U.S. Cl.
CPC .................................... *A44B 19/36* (2013.01)

(58) Field of Classification Search
CPC ......... A44B 19/36; F16B 21/02; H05K 1/184; H05K 2201/10189; H05K 7/142; H05K 7/00
See application file for complete search history.

(56) References Cited

U.S. PATENT DOCUMENTS

| | | | | |
|---|---|---|---|---|
| 3,752,511 | A * | 8/1973 | Racy | B65D 90/0013 410/82 |
| 4,506,419 | A * | 3/1985 | Mitomi | F16B 21/082 24/581.1 |
| 6,209,175 | B1 * | 4/2001 | Gershenson | F16B 5/065 411/509 |
| 6,490,766 | B1 * | 12/2002 | Tiemann | B65D 90/0013 410/83 |
| 11,018,452 | B2 * | 5/2021 | Wu | F16B 2/18 |
| 11,262,813 | B2 * | 3/2022 | Tsorng | H05K 1/141 |
| 2011/0262243 | A1 * | 10/2011 | Glickman | F16B 21/02 411/347 |
| 2019/0039824 | A1 * | 2/2019 | Hsieh | F16B 21/02 |
| 2020/0200216 | A1 * | 6/2020 | Wang | F16B 21/02 |
| 2020/0244008 | A1 * | 7/2020 | Wu | F16B 21/02 |
| 2021/0010499 | A1 * | 1/2021 | Wang | F16B 5/0642 |
| 2021/0064102 | A1 * | 3/2021 | Tseng | F16B 2/18 |

FOREIGN PATENT DOCUMENTS

| | | |
|---|---|---|
| DE | 102016215033 A1 | 2/2018 |
| TW | 202024491 A | 7/2020 |

\* cited by examiner

*Primary Examiner* — Robert Sandy
*Assistant Examiner* — Louis A Mercado

(57) ABSTRACT

A fastening device includes at least one base portion and at least one fastener portion. The base portion is connected to a first object and the fastener portion is slidably assembled to the base portion. The fastener portion cooperates with the base portion to provide a locking and an unlocking function for connecting or disconnecting a second object to or from the base portion. With these arrangements, two objects can be repeatedly and quickly connected to or disconnected from each other.

19 Claims, 20 Drawing Sheets

FASTENING DEVICE

CROSS-REFERENCE TO RELATED APPLICATION

This non-provisional application claims priority under 35 U.S.C. § 119(a) on Patent Application No(s). 109130605 filed in Taiwan, R.O.C. on Sep. 7, 2020, the entire contents of which are hereby incorporated by reference.

BACKGROUND OF THE INVENTION

1. Field of the Invention

The present disclosure relates to a fastening device, and more particularly, to a fastening device that can be repeatedly and quickly connected to or disconnected from at least one object.

2. Description of the Related Art

Generally, when it is necessary to fix at least one object, screws are usually used to thread into the object and accordingly fasten the object in place.

However, while the conventional fastening method enables fastening of at least one object in place in a non-easily-separable manner, the object fastened in place with screws would become uneasy for further assembling to other objects and could not be easily released from the fixed state.

BRIEF SUMMARY OF THE INVENTION

An objective of the present disclosure is to provide a fastening structure that includes a base portion for connecting to a first object and a fastener portion for removably locking a second object to the base portion, so that the second object can be quickly and repeatedly connected to or disconnected from the first object.

To achieve at least the above objective, the fastening device according to an embodiment of the present disclosure includes at least one base portion and at least one fastener portion. The base portion can be connected to a first object, and the fastener portion is slidably assembled to the base portion. The fastener portion cooperates with the base portion to provide a locking and an unlocking function to connect or disconnect a second object to or from the base portion.

To achieve at least the above objective, the fastening device according to another embodiment of the present disclosure includes at least one base portion and at least one fastener portion. The base portion can be connected to a first object. The base portion includes at least one limiting body and the first object is correspondingly provided with a limiting slot that includes at least one retaining section. When the limiting body is moved in the limiting slot to a location to engage with the retaining section, the base portion is brought to connect to the first object. The fastener portion is slidably assembled to the base portion and cooperates with the base portion to provide a locking and an unlocking function to thereby connect or disconnect a second object to or from the base portion.

Optionally, the base portion includes at least one connecting section for connecting the base portion to the first object.

Optionally, the connecting section is integrally extended from a bottom of the base portion.

Optionally, the connecting section is additionally connected to the bottom of the base portion Optionally, the connecting section is welded to, snapped onto, screwed into, expansion connected to or glued to the first object.

Optionally, the base portion is provided at two lateral sides with a slide section each, and the fastener portion is provided at two lateral sides with a corresponding slide section each. The corresponding slide sections are slidably engaged with the slide sections, such that the fastener portion is sideward slidably assembled to the base portion.

Optionally, the slide section is a groove or a guide rail and the corresponding slide section is a guide rail or a groove.

Optionally, the base portion is provided at two lateral sides with a stop section each, and the fastener portion is provided at two lateral sides with a corresponding stop section each. The corresponding stop sections are respectively detachably abutted on the stop sections, such that the mutually abutted stop sections and corresponding stop sections stop the fastener portion having locked the second object in place from moving relative to the base portion.

Optionally, either the stop sections or the corresponding stop sections are flexible for snap-fitting; and the stop sections or the corresponding stop sections are respectively provided with a beveled surface or a curved surface, such that the stop sections and the corresponding stop sections are slidably interlocked with one another.

Optionally, either the stop sections or the corresponding stop sections are flexible for snap-fitting; and the stop sections or the corresponding stop sections are respectively provided with a beveled slide surface or a curved slide surface, such that the stop sections and the corresponding stop sections are slidable relative to one another; and a portion of each of the stop sections or of the corresponding stop sections located immediately opposed to the slide surface is an abutting surface that defines a right angle, a near-right angle, or an angle larger than that defined by the slide surface to facilitate stable interlocking of the stop section to the corresponding stop section.

Optionally, the base portion is provided at an end with a resting section and the fastener portion is provided at an end with a fixing section. The fixing section is located corresponding to the resting section, such that the fixing section of the fastener portion cooperates with the resting section of the base portion to provide the locking and the unlocking function to connect or disconnect the second object to or from the base portion.

Optionally, the resting section is a stepped surface, such that a limiting section is formed between the resting section and the fixing section. The fixing section cooperates with the resting section to provide the locking function to thereby connect the second object to the limiting section, or the fixing section cooperates with the resting section to provide the unlocking function, such that the second object is disconnected from the limiting section.

Optionally, the fastener portion is provided with an operating section for operating and controlling the fastener portion to sideward slide or to pivot on and relative to the base portion.

Optionally, the operating section includes an anti-slip section.

Optionally, the operating section is provided on an end of the fastener portion. Alternatively, the operating section is provided on each of two lateral sides of the fastener portion.

Optionally, the base portion and the fastener portion have an elastic element disposed between them. The elastic element has an end pressed against the base portion and another end pressed against the fastener portion, such that the fastener portion is normally pushed by the elastic element to a locking position or an unlocking position.

Optionally, the base portion and the fastener portion have a pin element disposed between them. The pin element is provided on the base portion and the fastener portion includes a movement section that is movably connected to the pin element, such that the fastener portion is slidably assembled to the base portion.

Optionally, the fastening device includes two or more fastener portions. The fastener portions can be slidably assembled to the base portion in different ways, including being slidably assembled to a top and a bottom of the base portion, being parallelly arranged on and slidably assembled to the base portion, or being vertically superimposed on and slidably assembled to the base portion.

Optionally, the base portion is provided between the top and the bottom with a connecting section for connecting the base portion to the first object.

Optionally, the base portion is provided at the top and the bottom with a resting section each and the fastener portions are respectively provided with a fixing section. The resting sections are located corresponding to the fixing sections, such that the fixing sections on the fastener portion cooperate with the resting sections on the base portion to provide the locking and the unlocking function.

Optionally, the base portion is provided at two lateral sides of the top and the bottom with a slide section each, and the fastener portions are respectively provided at two lateral sides with a corresponding slide section each. The corresponding slide sections are respectively slidably engaged with one of the slide sections, such that the fastener portions are respectively sideward slidably assembled to the base portion.

Optionally, the base portion is provided at two lateral sides of the top and the bottom with a stop section each and the fastener portions are respectively provided at two lateral sides with a corresponding stop section each. The corresponding stop sections are respectively detachably abutted on one of the stop sections, such that the mutually abutted stop sections and corresponding stop sections stop the fastener portions having locked the second objects in place from moving relative to the base portion.

Optionally, the base portion and each of the fastener portions have an elastic element disposed between them. The elastic elements respectively have an end pressed against the base portion and another end pressed against the fastener portion, such that the fastener portions are normally pushed by the elastic elements to a locking position or an unlocking portion.

Optionally, the fastening device includes two or more base portions and two and more fastener portions. The fastener portions are respectively slidably assembled to the base portions. The base portions are connected to one another at their bottoms, and the fastener portions are parallelly arranged on the base portions or vertically superimposed on the base portions.

Optionally, the base portions respectively include a connecting section. A fastening element can be threaded through the connecting sections to thereby connect the base portions to the first object.

Optionally, the base portions respectively include a resting section and the fastener portions respectively include a fixing section. The resting sections are located corresponding to the fixing sections, such that the fixing sections of the fastener portions cooperate with the resting sections of the base portions to provide the locking and the unlocking function.

Optionally, the base portions are respectively provided at two lateral sides with a slide section each, and the fastener portions are respectively provided at two lateral sides with a corresponding slide section each. The corresponding slide sections are sideward slidably engaged with the slide sections, such that the fastener portions are respectively sideward slidably assembled to the base portions.

Optionally, the base portions are respectively provided on two lateral sides with a stop section each and the fastener portions are respectively provided on two lateral sides with a corresponding stop section each. The corresponding stop sections are respectively detachably abutted on the stop sections, such that the mutually abutted stop sections and corresponding stop sections stop the fastener portions having locked the second objects in place from moving relative to the base portions.

Optionally, an elastic element is disposed between each of the base portions and a corresponding one of the fastener portions. The elastic elements respectively have an end pressed against the base portion and another end pressed against the fastener portion, such that the fastener portions are normally pushed by the elastic elements to a locking position or an unlocking position.

Optionally, the limiting body can be a retractable or a deformable structure or formed of a retractable or deformable material, so that the limiting body is retractable or deformable to snap-fit on the retaining section.

Optionally, the first object connected to the base portion of the fastening device is a printed circuit board (PCB).

BRIEF DESCRIPTION OF THE DRAWINGS

To facilitate understanding of the objects, characteristics and effects of this present disclosure, embodiments together with the accompanying drawings for the detailed description of the present disclosure are provided. It is understood the accompanying drawings only describe some embodiments of the present disclosure; a person of ordinary skill in the art can make changes and modifications to the original drawings to obtain other useful drawings without doing creative work.

DETAILED DESCRIPTION OF THE INVENTION

Figure 1:
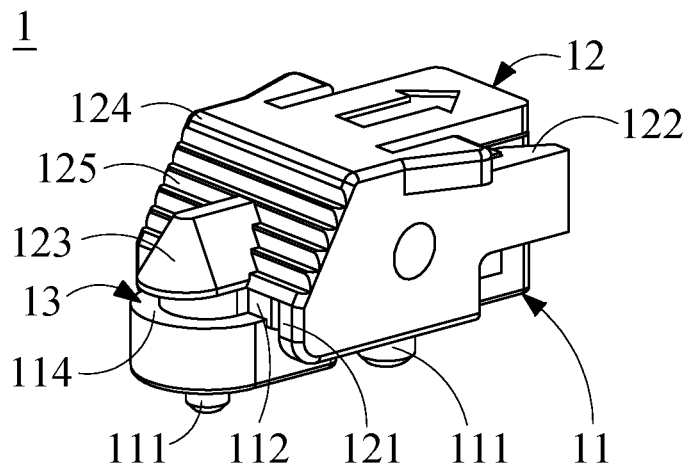
FIG. 1 is an assembled perspective view of a fastening device according to a first embodiment of the present disclosure.
Figure 2:
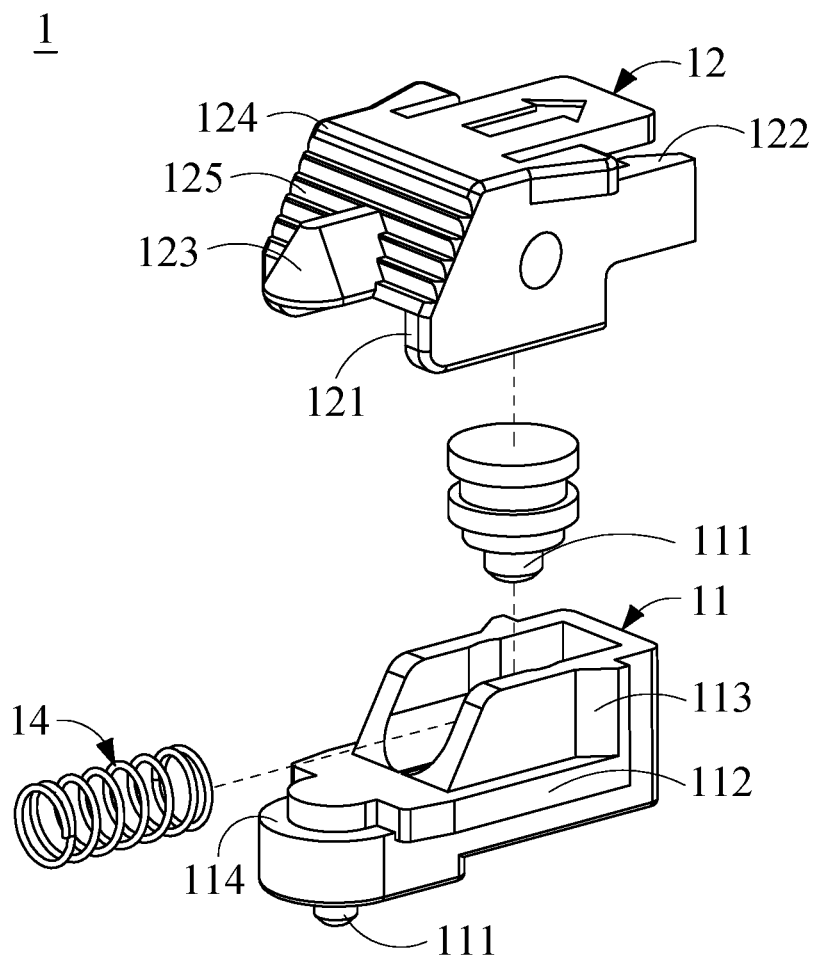
FIG. 2 is an exploded view of the fastening device of FIG. 1.
Figure 3:
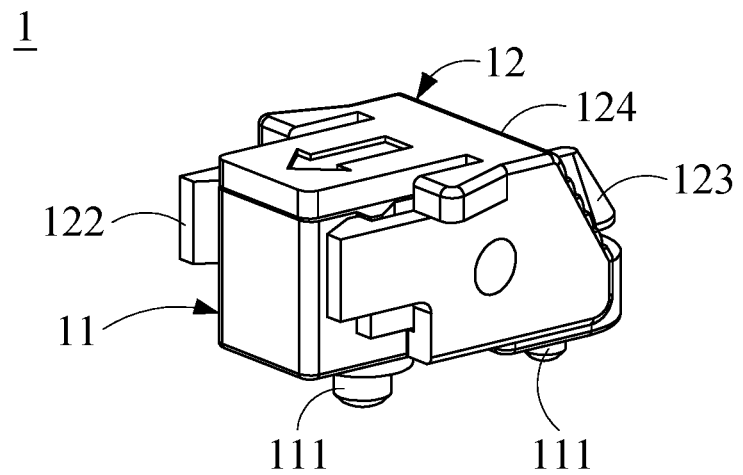
FIG. 3 is an assembled perspective view of the fastening device according to the first embodiment of the present disclosure viewed from another angle thereof.
Figure 4:
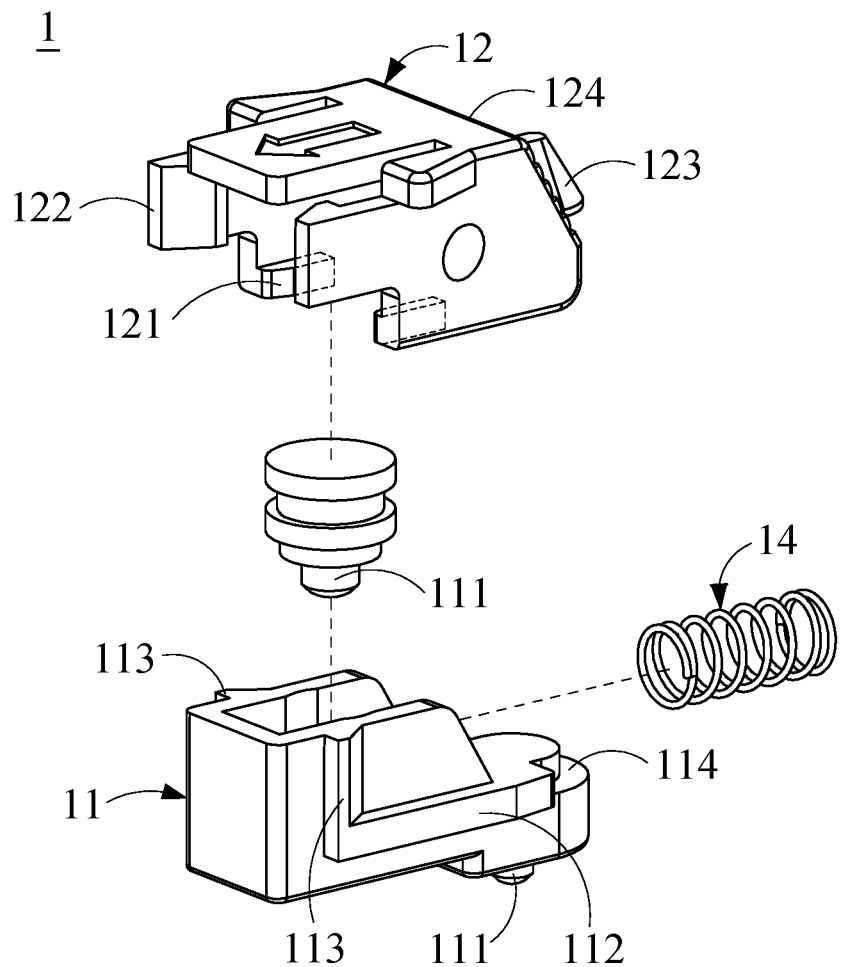
FIG. 4 is an exploded view of the fastening device of FIG. 3.

The present disclosure will now be described with some preferred embodiments thereof and by referring to the accompanying drawings. For the purpose of easy to understand, elements that are the same in the preferred embodiments are denoted by the same reference numerals Please refer to FIGS. 1 to 6. A fastening device 1 according to a first embodiment of the present disclosure includes at least one base portion 11 and at least one fastener portion 12.

The base portion 11 can be connected to a first object 10.

The fastener portion 12 is slidably assembled to the base portion 11, such that the fastener portion 12 cooperates with the base portion 11 to provide a locking and an unlocking function for connecting or disconnecting a second object 20 to or from the base portion.

Figure 5:
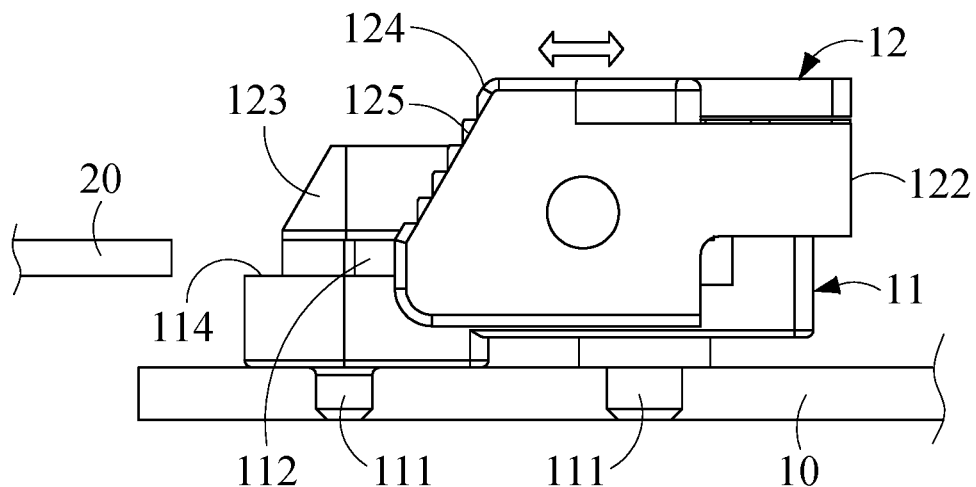
FIG. 5 is a first side view showing the use of the fastening device according to the first embodiment of the present disclosure.
Figure 6:
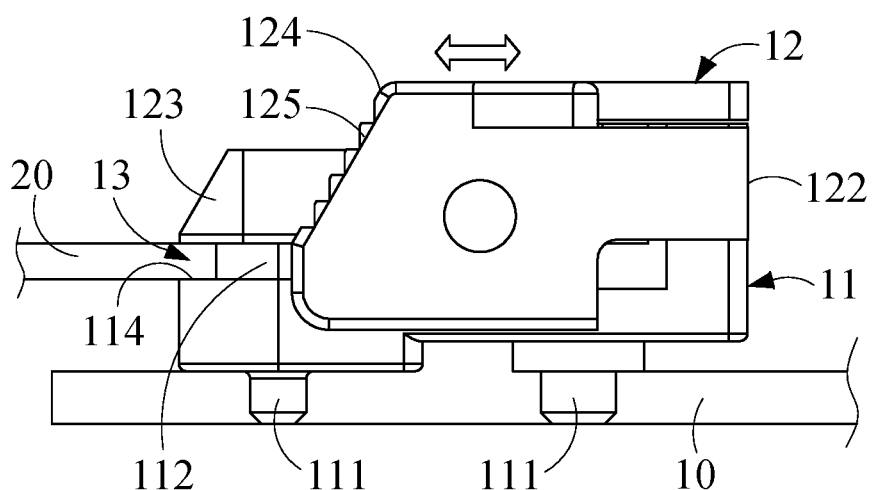
FIG. 6 is a second side view showing the use of the fastening device according to the first embodiment of the present disclosure.

To use the fastening device 1 of the first embodiment, first connect the base portion 11 to the first object 10. The first object 10 can be a printed circuit board (PCB). Then, sideward move the fastener portion 12 from a first end to an opposite second end of the base portion 11 and put the second object 20 on the first end of the base portion 11, as shown in FIG. 5. Thereafter, sideward move the fastener portion 12 again toward the second object 20 to lock the second object 20 in place on the base portion 11, as shown in FIG. 6. When it is desired to remove the second object 20 from the base portion 11, simply move the fastener portion 12 sideward again, so that the fastener portion 12 is moved away from the second object 20 to unlock the same. At this point, the second object 20 can be removed from the base portion 11, as shown in FIG. 5. In this manner, when the base portion 11 is connected to the first object 10, the fastener portion 12 cooperates with the base portion 11 to provide a locking and an unlocking function to connect or disconnect the second object 20 to or from the base portion, respectively, enabling two objects to be repeatedly and quickly connected to or disconnected from each other.

In the first embodiment of the present disclosure, the base portion 11 includes at least one connecting section 111, which can be welded to, snapped onto, screwed into, expansion connected to or glued to the first object 10 and therefore connects the base portion 11 to the first object 10. In this manner, the base portion 11 can be securely connected to the first object 10 to facilitate subsequent movement of the fastener portion 12 on and relative to the base portion 11.

In the illustrated first embodiment of the present disclosure, the base portion 11 includes two connecting sections 111, one of which is integrally extended from a bottom of the base portion 11 while the other one of which is additionally connected to the bottom of the base portion 11. In another operable embodiment, both of the two connecting sections 111 are integrally extended from the bottom of the base portion 11. In a further operable embodiment, both of the two connecting sections 111 are additionally connected to the bottom of the base portion 11. With the provision of the connecting sections 111, the base portion 11 can be stably and securely connected to the first object 10 to facilitate subsequent movement of the fastener portion 12 on and relative to the base portion 11.

In the first embodiment of the present disclosure, the base portion 11 is provided at two lateral sides with a slide section 112 each, and the fastener portion 12 is provided at two lateral sides with a corresponding slide section 121 each. The corresponding slide sections 121 are respectively slidably engaged with the slide sections 112, such that the fastener portion 12 is sideward slidably assembled to the base portion 11. The slide sections 112 can be respectively a groove or a guide rail, and the corresponding slide sections 121 can be respectively a guide rail or a groove. Through the slidable engagement of the corresponding slide sections 121 with the slide sections 112, the fastener portion 12 being sideward moved on and relative to the base portion 11 can slide smoothly to advantageously lock or unlock the second object 20.

In the first embodiment of the present disclosure, the base portion 11 is further provided at its two lateral sides with a stop section 113 each, and the fastener portion 12 is provided at its two lateral sides with a corresponding stop section 122 each. The corresponding stop sections 122 are respectively detachably abutted on the stop sections 113, such that the mutually abutted stop sections 113 and corresponding stop sections 122 stop the fastener portion 12 having locked the second object 20 in place from moving relative to the base portion to ensure secured locking of the second object 20 in place by the fastener portion 12.

In the illustrated first embodiment of the present disclosure, either the stop sections 113 or the corresponding stop sections 122 are flexible for snap-fitting. The stop sections 113 or the corresponding stop sections 122 are respectively provided with a beveled slide surface or a curved slide surface, such that the stop sections 113 and the corresponding stop sections 122 are slidable relative to one another. Further, a portion of each of the stop sections 113 or of the corresponding stop sections 122 located immediately opposed to the slide surface is an abutting surface that defines a right angle, a near-right angle, or an angle larger than that defined by the slide surface to facilitate stable abutting of the stop section 113 on the corresponding stop section 122, so that the fastening device 1 of the present disclosure is more practical for use.

In the first embodiment of the present disclosure, the base portion 11 has a resting section 114 provided at the first end thereof and the fastener portion 12 has a fixing section 123 provided at an end corresponding to the first end of the base portion 11, such that the resting section 114 are located corresponding to the fixing section 123. When using the fastening device 1, sideward slide the fastener portion 12 toward the second end of the base portion 11 and place the second object 20 on the resting section 114 of the base portion 11, as shown in FIG. 5, and then sideward slide the fastener portion 12 toward the second object 20, so that the fixing section 123 of the fastener portion 12 locks the second object 20 in place on the resting section 114 to complete the connection of the fastener portion 2 to the second object 20, as shown in FIG. 6. When it is desired to separate the fastener portion 12 from the second object 20, simply sideward slide the fastener portion 12 again toward the second end of the base portion 11 to move the fixing section 123 of the fastener portion 12 away from the second object 20 to unlock the second object 20, and the second object 20 can be now removed from the resting section 114 of the base portion 11, as shown in FIG. 5. In the above manner, the base portion 11 is first connected to the first object 10 and the fastener portion 12 cooperates with the base portion 11 to provide a locking and an unlocking function for locking or unlocking the second object 20, respectively, to the base portion 11. Therefore, two objects can be repeatedly and quickly connected to or disconnected from each other. More particularly, the fixing section 123 of the fastener portion 12 cooperates with the resting section 114 of the base portion 11 to provide the locking and the unlocking function to connect or remove the second object 20 to or from the base portion 11.

In the illustrated first embodiment of the present disclosure, the resting section 114 is a stepped surface, such that a limiting section 13 is formed between the fixing section 123 and the resting section 114. That is, the fixing section 123 cooperates with the resting section 114 to lock the second object 20 to the limiting section 13; or the fixing section 123 is moved away from the resting section 114 to expose the limiting section 13 and allow the second object 20 to be removed from the limiting section 13 of the resting section 114. To use the fastening device 1, first sideward slide the fastener portion 12 from the first end to the second end of the base portion 11 and place the second object 20 on the resting section 114 of the base portion 11, as shown in FIG. 5, and then sideward slide the fastener portion 12 toward the second object 20 until the fixing section 123 of the fastener portion 12 locks the second object 20 in place in the limiting section 13, as shown in FIG. 6. At this point, the connection of the fastener portion 12 to the second object 20 is completed. When it is desired to remove the second object 20 from the fastening device 1, simply sideward slide the fastener portion 12 toward the second end of the base portion 11 to move the fixing section 123 away from the limiting section 13. At this point, the limiting section 13 is exposed and in an open state, so that the second object 20 can be removed from the resting section 114 of the base portion 11, as shown in FIG. 5. Thus, the base portion 11 can be first connected to the first object 10, and the fastener portion 12 can cooperate with the base portion 11 to provide a locking and an unlocking function to lock or unlock the second object 20 to or from the base portion 11, so as to achieve quick and repeated connection or disconnection of two objects to or from each other. More specifically, the fixing section 123 of the fastener portion 12 cooperates with the resting section 114 of the base section 11 to provide the locking and unlocking function for connecting or disconnecting the second object 20 to or from the base portion 11.

In the first embodiment of the present disclosure, the fastener portion 12 is provided with an operating section 124 for operating and controlling the fastener portion 12 to sideward slide or pivot on and relative to the base portion 11. The operating section 124 is located at an end of the fastener portion 12 and includes an anti-slip section 125. To control the movement of the fastener portion 12 on the base portion 11, simply apply a force to the anti-slip section 125 of the operating section 124. In this manner, the force can be stably applied to the operating section 124, enabling the fastener portion 12 to cooperate with the base portion 11 to provide the locking and the unlocking function. Thus, the fastener portion 12 can lock or unlock the second object 20 to or from the base portion 11 to achieve quick and repeated connection or disconnection of two objects to or from each other.

In the first embodiment of the present disclosure, the base portion 11 and the fastener portion 12 have an elastic element 14 disposed between them. The elastic element 14 has an end pressed against the base portion 11 and another end pressed against the fastener portion 12, so that the fastener portion 12 is normally pushed by the elastic element 14 to a locking position. Alternatively, in another operable embodiment, the fastener portion 12 is normally pushed by the elastic element 14 to an unlocking position.

When using the fastening device 1, a force is applied to the operating section 124 for the fastener portion 12 to slide sideward. At this point, the elastic element 14 is elastically compressed. Then, place the second object 20 on the resting section 114 of the base portion 11 and release the fastener portion 12. At this point, the elastic element 14 releases its elasticity to automatically push the fastener portion 12 sideward to slide toward the second object 20, such that the fixing section 123 of the fastener portion 12 locks the second object 20 in place in the limiting section 13 of the resting section 114 to complete the connection of the fastener portion 12 to the second object 20, as shown in FIG. 6. When it is desired to remove the second object 20, simply sideward slide the fastener portion toward the second end of the base portion 11 again to move the fixing section 123 away from the limiting section 13. At this point, the elastic element 14 is elastically compressed and the limiting section 13 is exposed and in an open state, so that the second object 20 can be removed from the resting section 114 of the base portion 11, as shown in FIG. 5. After removal of the second object 20, release the fastener portion 12. At this point, the elastic element 14 releases it elasticity to automatically move the fastener portion 12 to the locking position, and the fastening device 1 can be used next time. In this manner, the base portion 11 can be first connected to the first object 10, and the fastener portion 12 cooperates with the base portion 11 to provide a locking and an unlocking function for locking or unlocking the second object 20 to or from the base portion 11, so as to achieve quick and repeated connection or disconnection of two objects to or from each other.

Figure 7:
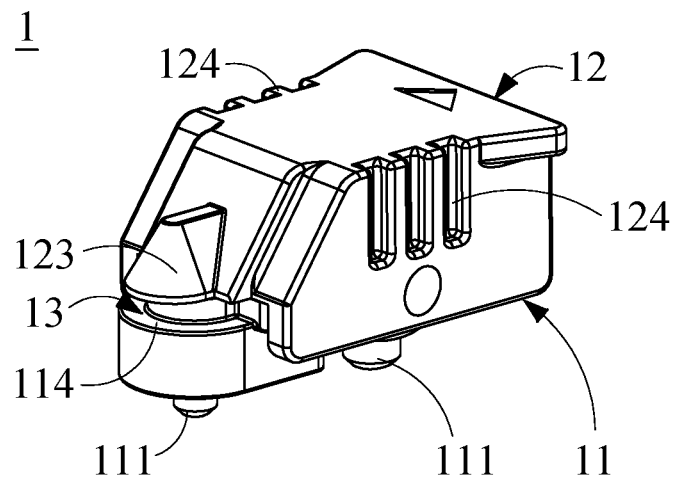
FIG. 7 is an assembled perspective view of a fastening device according to a second embodiment of the present disclosure.
Figure 8:
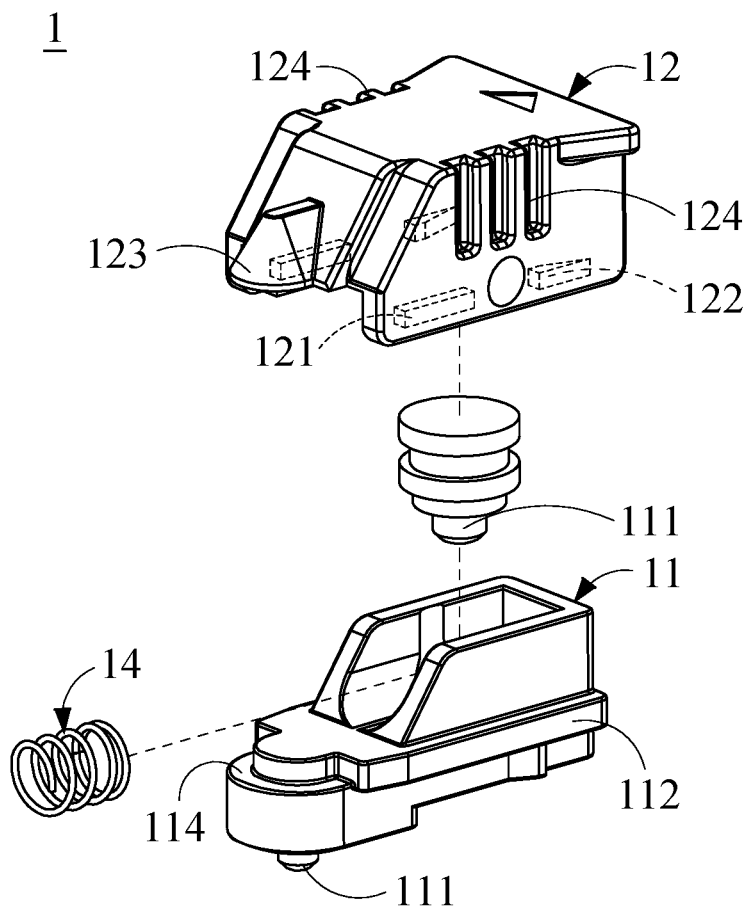
FIG. 8 is an exploded view of the fastening device of FIG. 7.
Figure 9:
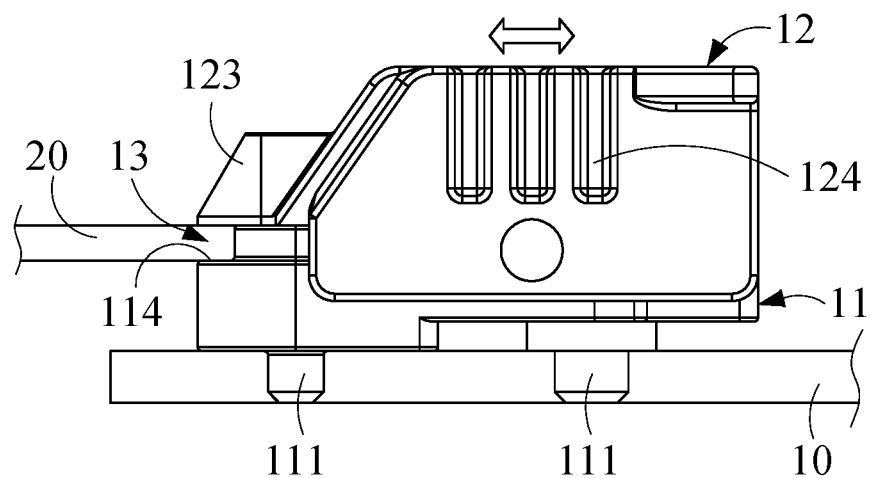
FIG. 9 is a side view showing the use of the fastening device according to the second embodiment of the present disclosure.

Please refer to FIGS. 7 to 9, in which a fastening device 1 according to a second embodiment of the present disclosure is shown. The second embodiment is different from the first one in that the slide sections 112 and the corresponding slide sections 121 as well as the stop sections 113 and the corresponding stop sections 122 in the second embodiment are provided on the base portion 11 and the fastener portion 12, respectively, at locations different from that in the first embodiment; and the fastener portion 12 in the second embodiment has the operating section 124 provided on each of two lateral sides thereof.

To use the fastening device 1 of the second embodiment, first apply a force to the operating sections 124 so that the fastener portion 12 is controlled to sideward slide toward the second end of the base portion 11. At this point, the elastic element 14 is compressed. Then, put the second object 20 on the resting section 114 of the base portion 11 and release the fastener portion 12. At this point, the elastic element 14 releases its elasticity to automatically push the fastener portion 12 sideward to slide toward the second object 20, such that the fixing section 123 of the fastener portion 12 locks the second object 20 in place in the limiting section 13 of the resting section 114 to complete the connection of the second object 20 to the base portion 11, as shown in FIG. 6. When it is desired to remove the second object 20, simply sideward slide the fastener portion toward the unlocking position at the second end of the base portion 11 to move the fixing section 123 away from the limiting section 13. At this point, the elastic element 14 is elastically compressed and the limiting section 13 is exposed and in an open state, so that the second object 20 can be removed from the resting section 114 of the base portion 11, as shown in FIG. 5. After removal of the second object 20, release the fastener portion 12. At this point, the elastic element 14 releases it elasticity to automatically move the fastener portion 12 to the locking position, and the fastening device 1 can be used next time. In this manner, the base portion 11 can be first connected to the first object 10, and the fastener portion 12 cooperates with the base portion 11 to provide a locking and an unlocking function to lock or unlock the second object 20 to or from the base portion 11, so as to achieve quick and repeated connection or disconnection of two objects to or from each other.

Figure 10:
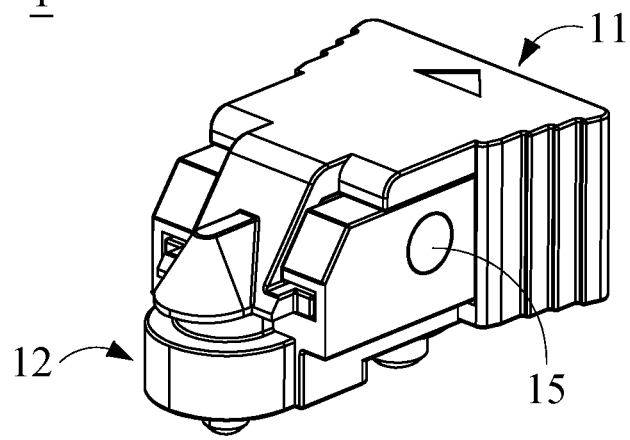
FIG. 10 is an assembled perspective view of a fastening device according to a third embodiment of the present disclosure.
Figure 11:
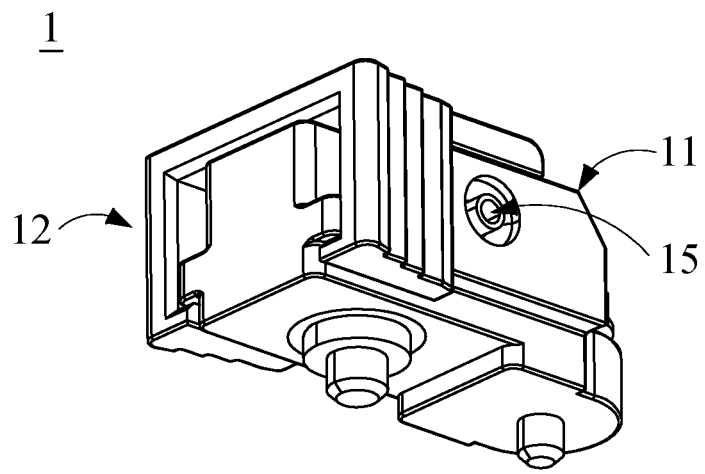
FIG. 11 is an assembled perspective view of the fastening device according to the third embodiment of the present disclosure viewed from another angle thereof.
Figure 12:
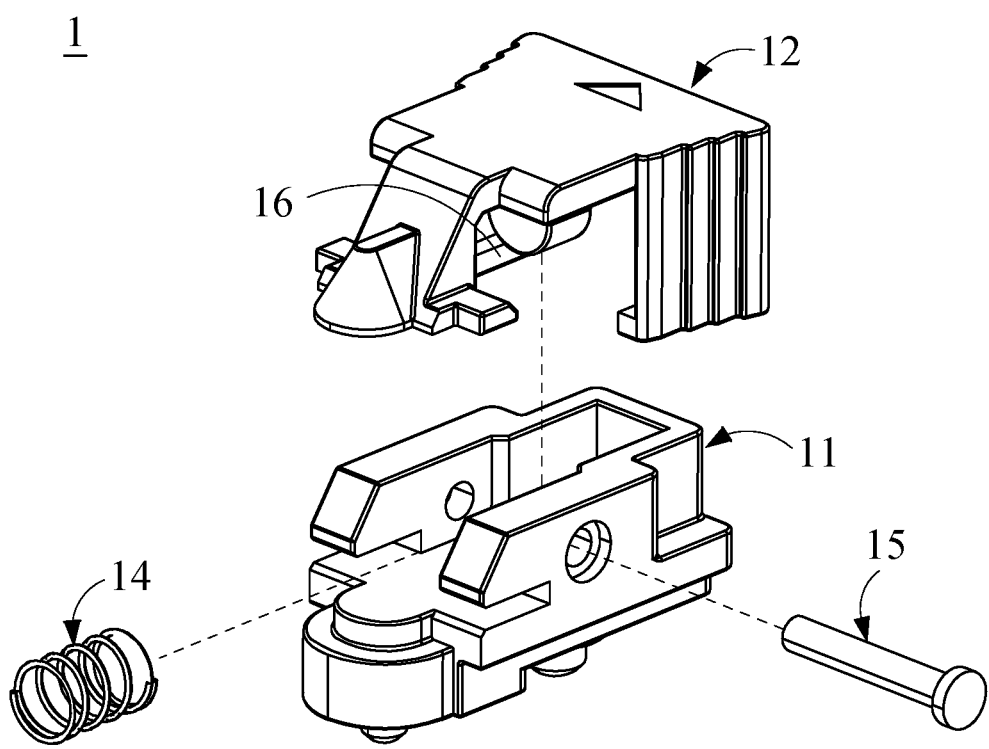
FIG. 12 is an exploded view of the fastening device of FIG. 10.

Please refer to FIGS. 10 to 12, in which a fastening device 1 according to a third embodiment of the present disclosure is shown. The third embodiment is different from the second one in further including a pin element 15, which is provided on the base portion 11 to extend between the base portion 11 and the fastener portion 12, and a movement section 16, which is provided on the fastener portion 12. The movement section 16 is movably connected to the pin element 15, such that the fastener portion 12 is slidably assembled to the base portion 11. With these arrangements, the fastener portion 12 cooperates with the base portion 11 to provide a locking and an unlocking function, so that the fastener portion 12 can lock or unlock the second object 20 to or from the base portion 11.

Figure 13:
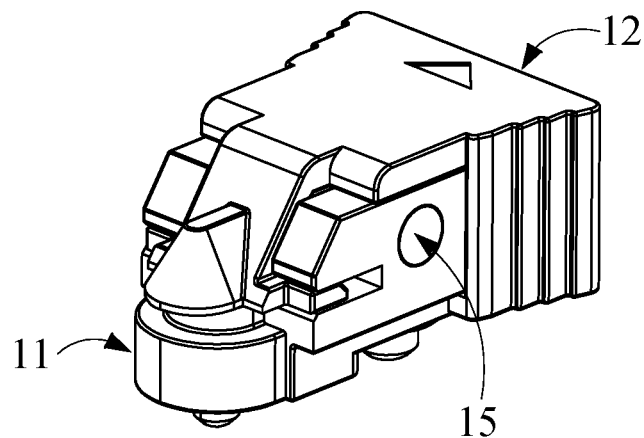
FIG. 13 is an assembled perspective view of a fastening device according to a fourth embodiment of the present disclosure.
Figure 14:
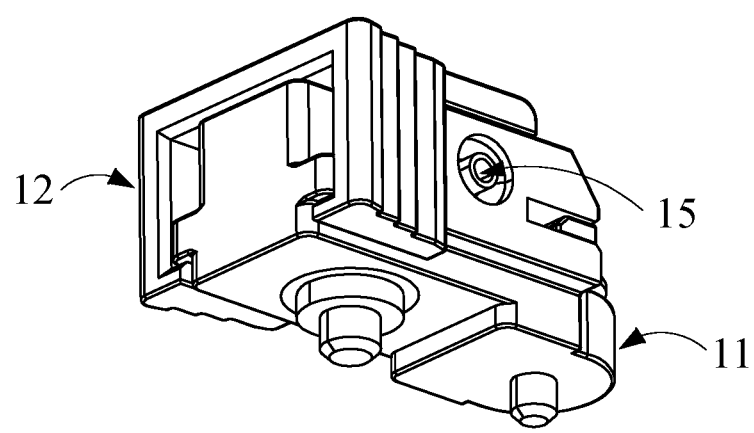
FIG. 14 is an assembled perspective view of the fastening device according to the fourth embodiment of the present disclosure viewed from another angle thereof.
Figure 15:
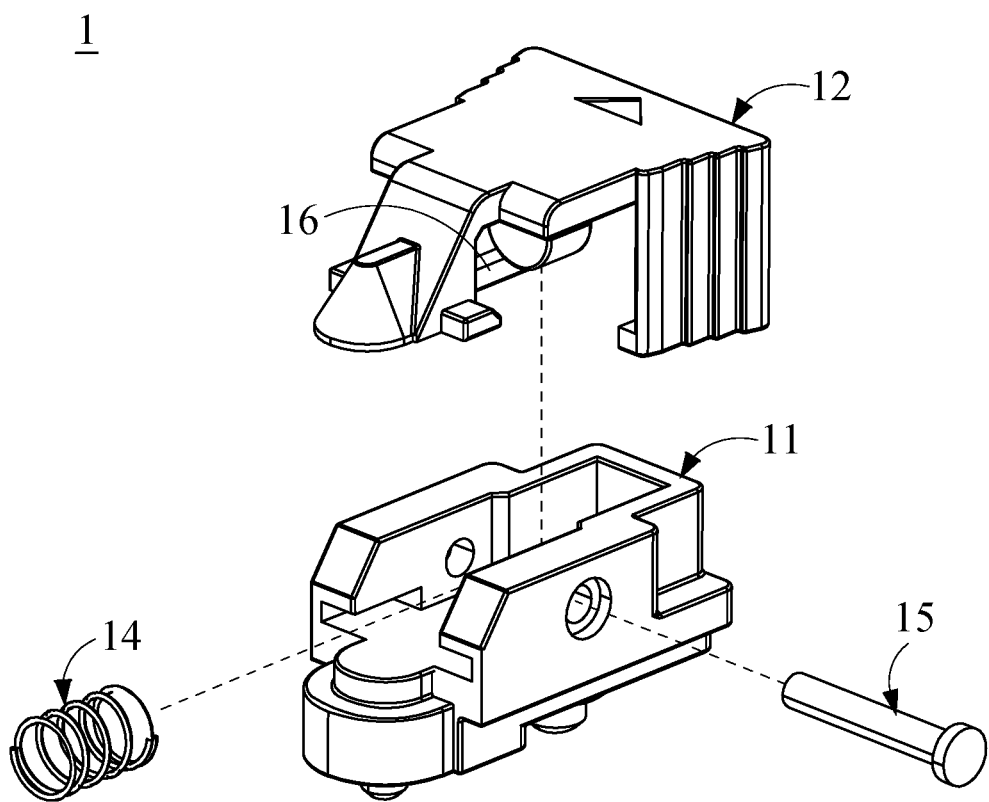
FIG. 15 is an exploded view of the fastening device of FIG. 13.

Please refer to FIGS. 13 to 15, in which a fastening device 1 according to a fourth embodiment of the present disclosure is shown. The fourth embodiment is different from the third one in that the base portion 11 and the fastener portion 12 in the fourth embodiment respectively have a configuration different from that of the base portion 11 and the fastener portion 12 in the third embodiment. However, the base portion 11 and the fastener portion 12 in the fourth embodiment are also slidably assembled via connection of the pin element 15 to the movement section 16. Therefore, in the fourth embodiment, the fastener portion 12 can also cooperate with the base portion 11 to provide a locking and an unlocking function, so that the fastener portion 12 can lock or unlock the second object 20 to or from the base portion 11.

Figure 16:
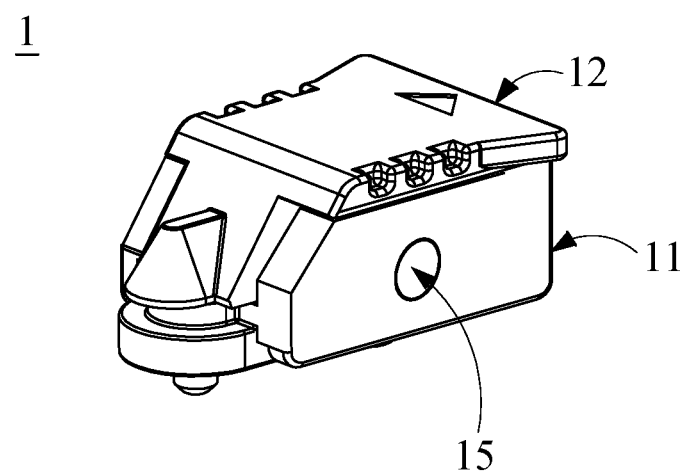
FIG. 16 is an assembled perspective view of a fastening device according to a fifth embodiment of the present disclosure.
Figure 17:
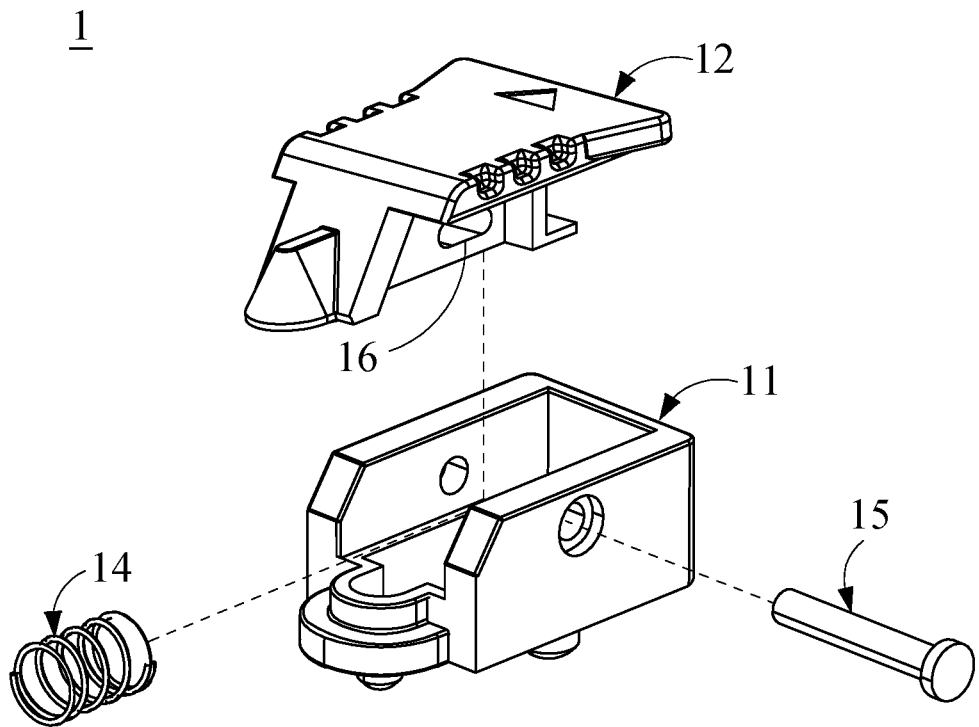
FIG. 17 is an exploded view of the fastening device of FIG. 16.
Figure 18:
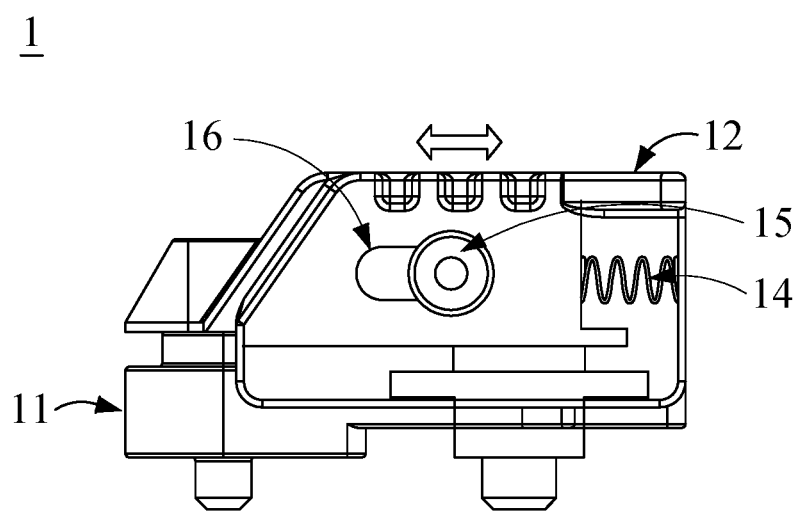
FIG. 18 is a sectioned side view of the fastening device according to the fifth embodiment of the present disclosure.
Figure 19:
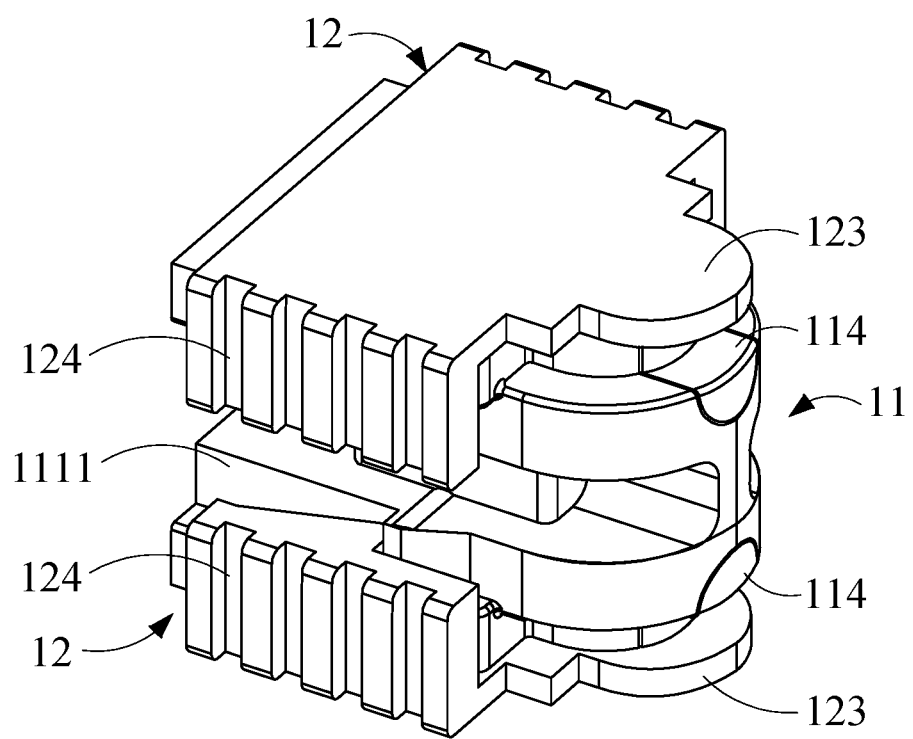
FIG. 19 is an assembled perspective view of a fastening device according to a sixth embodiment of the present disclosure.
Figure 20:
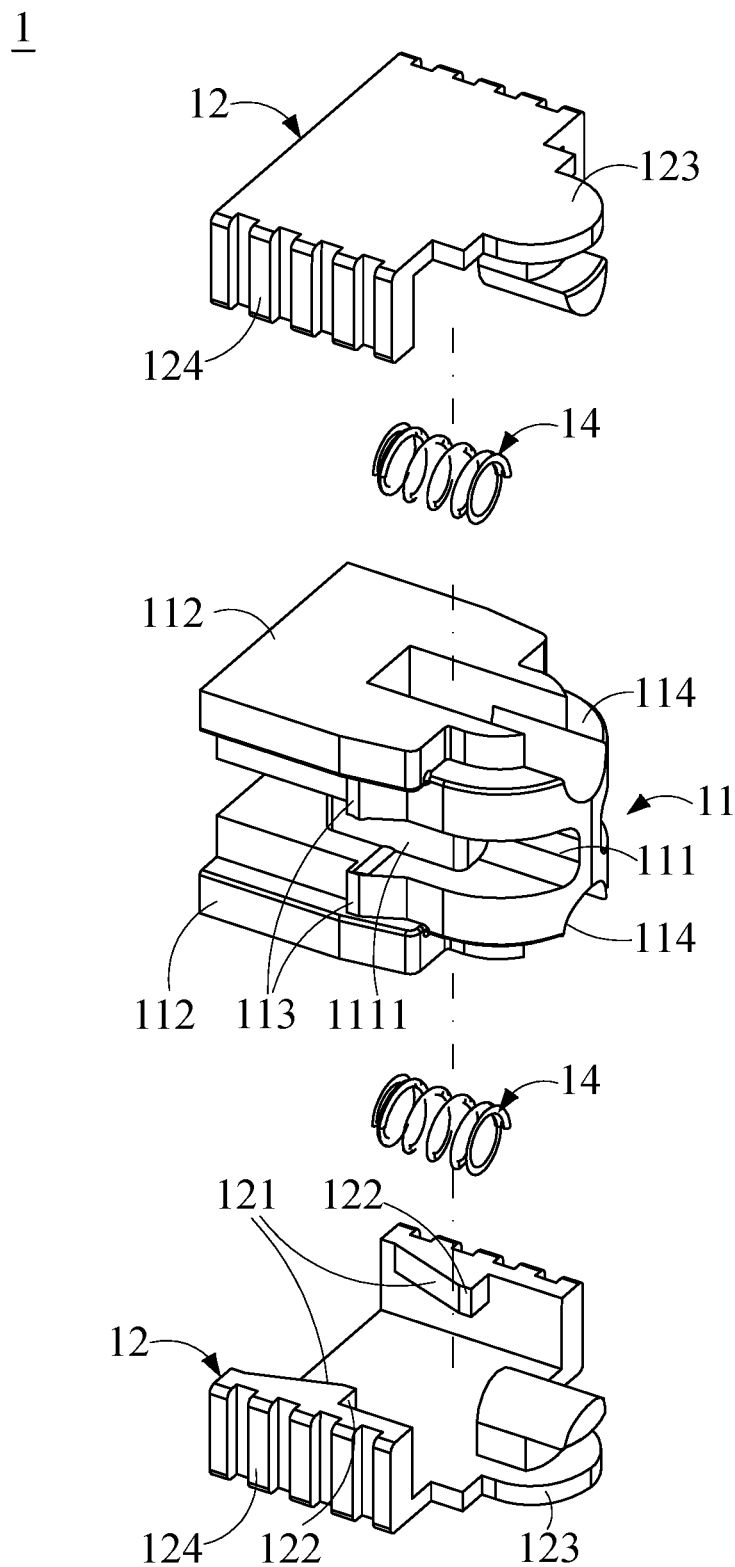
FIG. 20 is an exploded view of the fastening device of FIG. 19.
Figure 21:
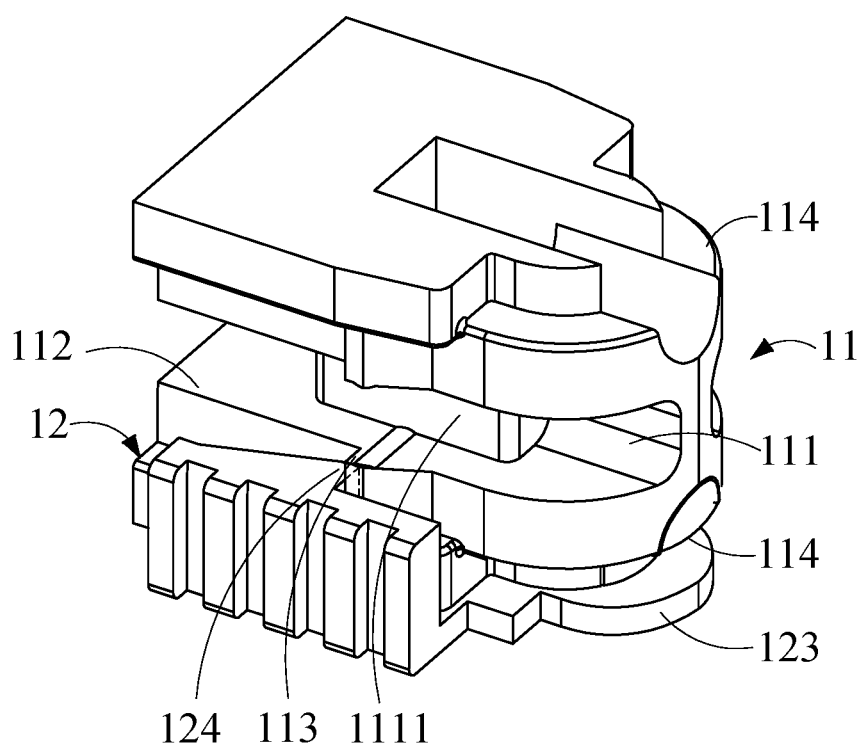
FIG. 21 is an assembled perspective view of the fastening device according to the sixth embodiment of the present disclosure viewed from another angle thereof.
Figure 22:
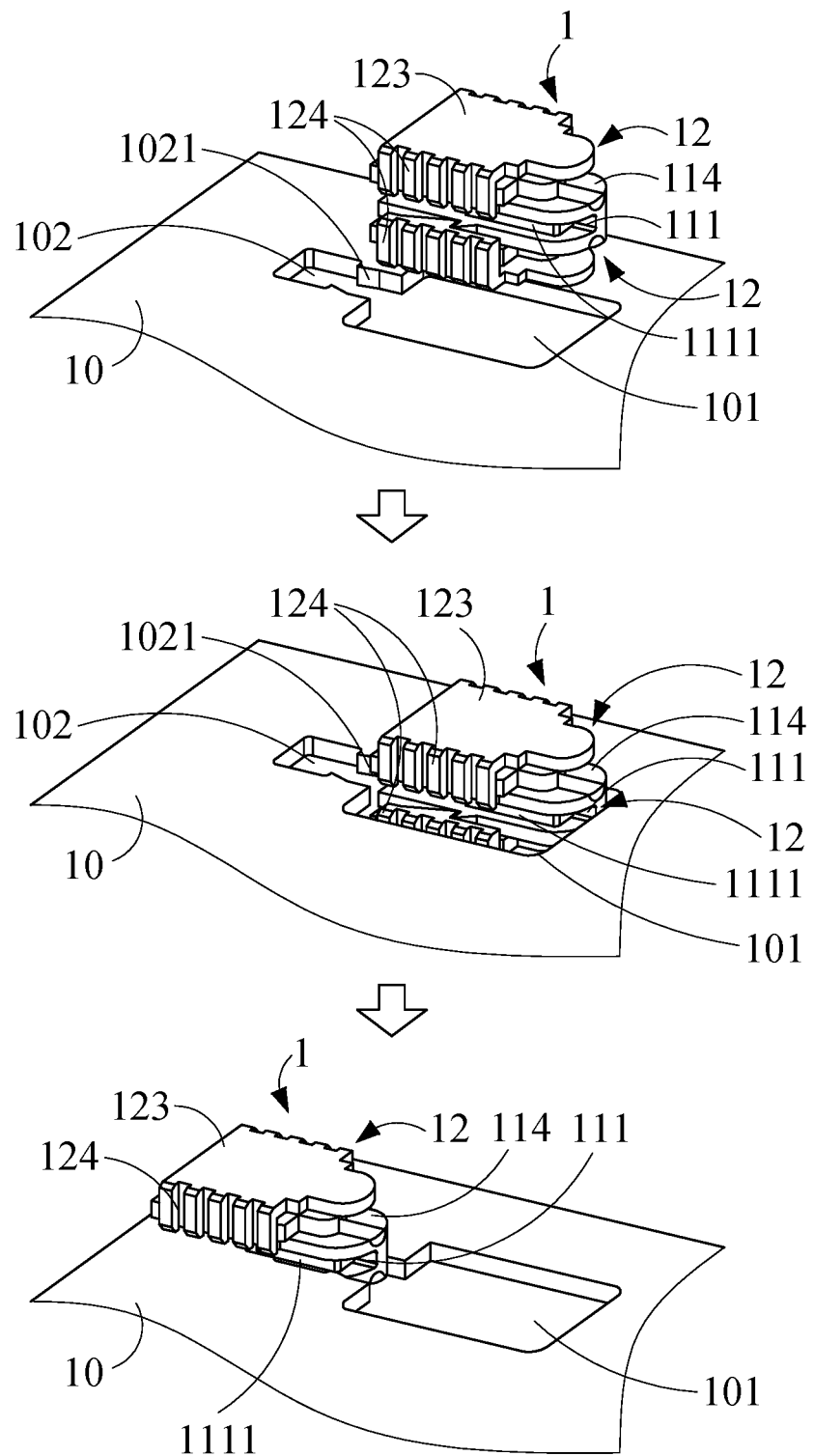
FIG. 22 is a first view showing the use of the fastening device according to the sixth embodiment of the present disclosure.
Figure 23:
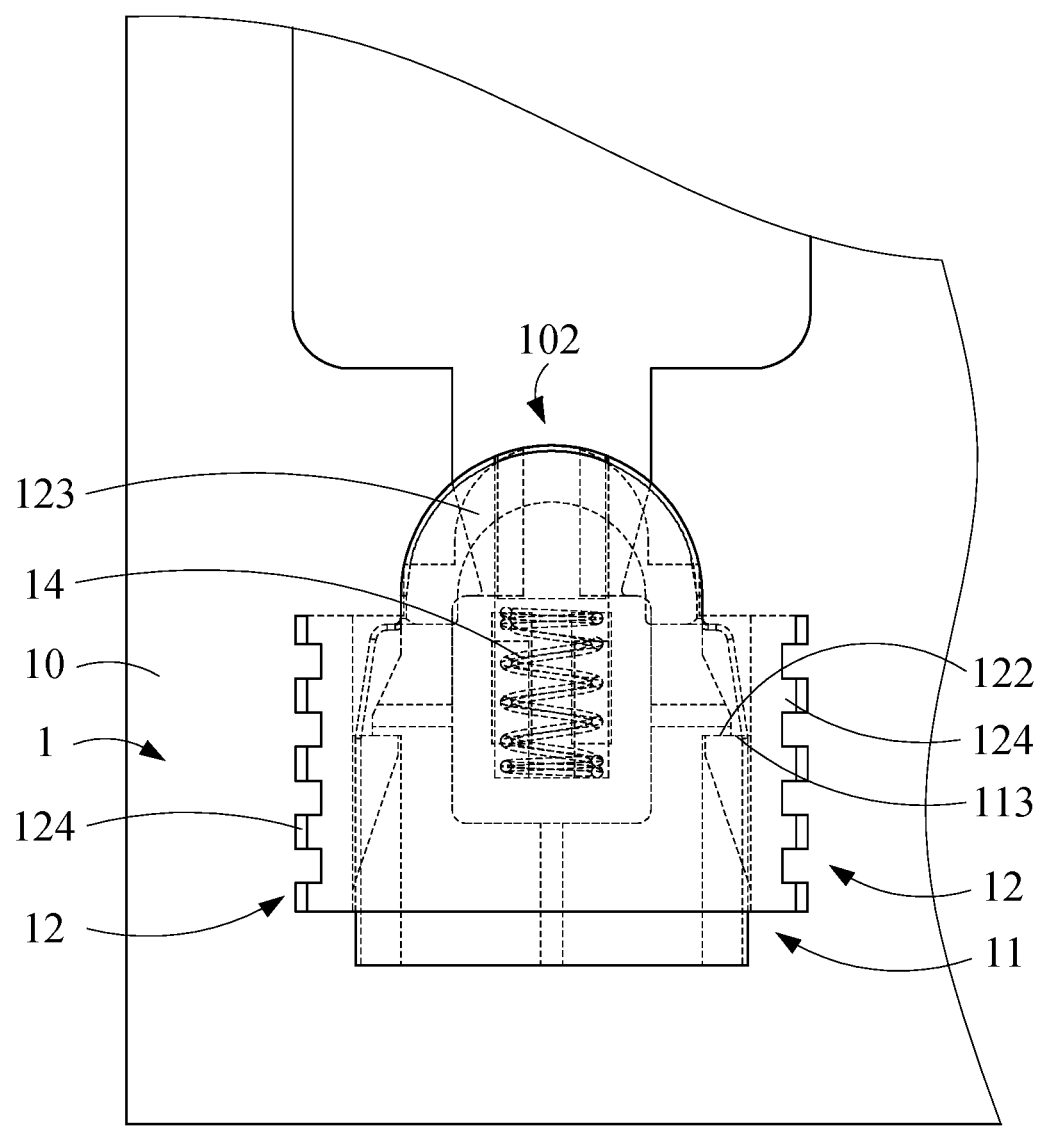
FIG. 23 is a second view showing the use of the fastening device according to the sixth embodiment of the present disclosure.

Please refer to FIGS. 16 to 18, in which a fastening device 1 according to a fifth embodiment of the present disclosure is shown. The fifth embodiment is different from the fourth one in that the base portion 11 and the fastener portion 12 in the fifth embodiment respectively have a configuration different from that of the base portion 11 and the fastener portion 12 in the fourth embodiment. However, the base portion 11 and the fastener portion 12 in the fifth embodiment are also slidably assembled via connection of the pin element 15 to the movement section 16. Therefore, in the fifth embodiment, the fastener portion 12 can also cooperate with the base portion 11 to provide a locking and an unlocking function, so that the fastener portion 12 can lock or unlock the second object 20 to or from the base portion 11.

Please refer to FIGS. 19 to 23, in which a fastening device 1 according to a sixth embodiment of the present disclosure is shown. The sixth embodiment is different from the previous embodiments in that the fastening device 1 includes two fastener portions 12, which are separately slidably assembled to a top and a bottom of the base portion 11. In the sixth embodiment, a connecting section 111 is provided between the top and the bottom of the base portion 11, and the first object 10 is connected to the connecting section 111 of the base portion 11 and located between the two fastener portions 12. Further, two resting sections 114 are separately provided on the top and the bottom of the base portion 11 and two fixing sections 123 are separately provided on the two fastener portions 12 corresponding to the resting sections 114, such that the fixing sections 123 of the fastener portions 12 cooperate with the resting sections 114 of the base portion 11 to provide a locking and an unlocking function. Further, the base portion 11 is provided at two lateral sides of its top and bottom with a slide section 112 each, and the fastener portions 12 are respectively provided at two lateral sides with a corresponding slide section 121 each. The corresponding slide sections 121 are respectively slidably engaged with the slide sections 112, such that the fastener portions 12 are sideward slidably assembled to the base portion 11. The base portion 11 is also provided at two lateral sides of its top and bottom with a stop section 113 each, and the fastener portions 12 are respectively provided at two lateral sides with a corresponding stop section 122 each. The corresponding stop sections 122 are respectively detachably abutted on the stop sections 113, such that the mutually abutted stop sections 113 and corresponding stop sections 122 stop the fastener portions 12 having moved into the locking position from moving relative to the base portion 11.

In addition, an elastic element 14 is disposed between the base portion 11 and each of the two fastener portions 12. The elastic elements 14 respectively have an end pressed against the base portion 11 and another end pressed against one of the two fastener portions 12, so that the fastener portions 12 are normally pushed by the elastic elements 14 to the locking position. Alternatively, in another operable embodiment, the fastener portions 12 are normally pushed by the elastic element 14 to the unlocking position.

To use the fastening device 1 of the sixth embodiment, first align the connecting section 111 of the base portion 11 with a mounting hole 101 provided on the first object 10 and then move the base portion 11 until the connecting section 111 slides into a limiting slot 102 on the first object 10. The limiting slot 102 includes at least one retaining section 1021, and the connecting section 111 includes at least one limiting body 1111. When the connecting section 111 is slid into the limiting slot 102, the limiting body 1111 and the retaining section 1021 stably abut on one another to thereby connect the fastening device 1 to the first object 10 while the two fastener portions 12 are separately located above and below the first object 10. The limiting body 1111 can be a retractable or a deformable structure or formed of a retractable or deformable material, so that the limiting body 1111 is retractable or deformable to pass through the retaining section 1021 and snap-fitted into the limiting slot 102. The limiting body 1111 can be in the form of a block and the retaining section 1021 can be in the form of a barb, so as to increase the stability of the limiting body 1111 and the retaining section 1021 when they are abutted on one another.

When using the fastening device 1, first apply a force to the operating sections 124 to sideward slide the fastener portions 12 toward the second end of the base portion 11. When the fastener portions 12 are sideward sliding on and relative to the base portion 11, the corresponding slide sections 121 engage with the slide sections 112 to enable smooth sliding of the fastener portions 12. At this point, the elastic elements 14 are compressed. Then, place a second object and a third object (not shown) on the resting sections 114 on the top and the bottom of the base portion 11, respectively, with the fixing sections 123 of the fastener portions 12 directing toward the second and the third object. Thereafter, release the fastener portions 12. At this point, the elastic elements 14 release their elasticity to sideward move the fixing sections 123 of the fastener portions 12 toward the second and the third object until the corresponding stop sections 122 of the fastener portions 12 and the stop sections 113 of the base portion 11 are abutted on one another. At this point, the mutually abutted stop sections 113 and corresponding stop sections 122 stop the fastener portions 12 having moved into the locking portion from moving relative to the base portion 11 to complete the locking of the second and the third object to the base portion 11.

When it is desired to remove the second and the third object, simply sideward slide the fastener portions 12 toward the second end of the base portion 11 again. At this point, the elastic elements 14 are compressed, and the fixing sections 123 of the fastener portions 12 are moved to the unlocking position to unlock the second and the third object, allowing the second and the third object to be removed from the resting sections 114 of the base portion 11. After the second and the third object have been removed, the fastener portions 12 are released and the elastic elements 14 release their elasticity to automatically push the fastener portions 12 to the locking position again for use next time. At this point, the disconnection of the base portion 12 from the second and the third object is completed.

Figure 24:
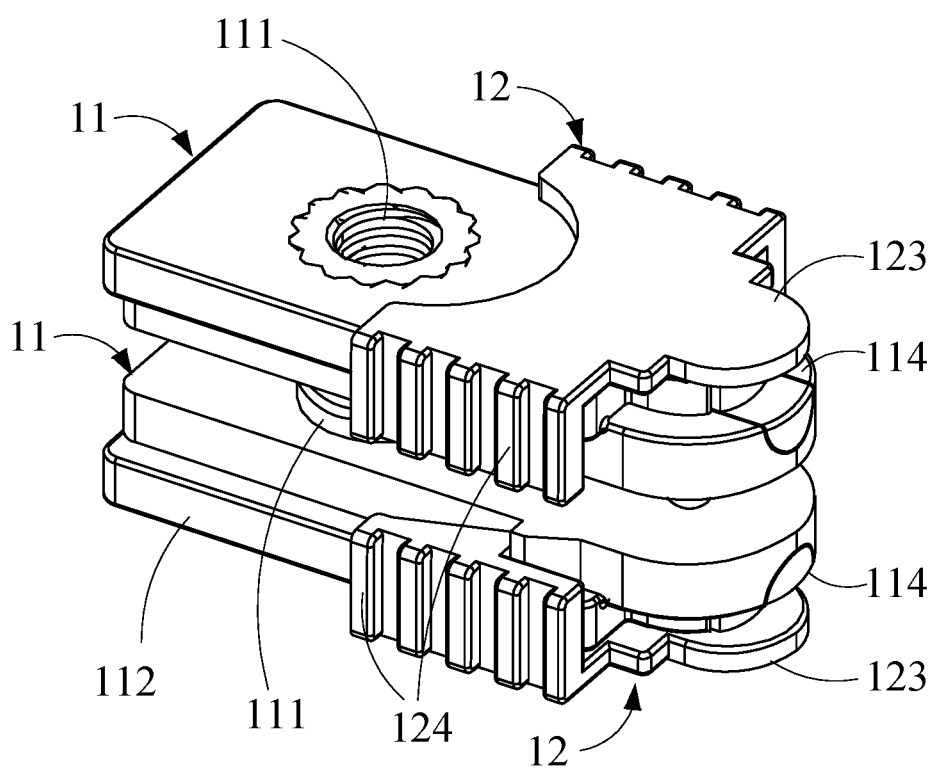
FIG. 24 is an assembled perspective view of a fastening device according to a seventh embodiment of the present disclosure.
Figure 25:
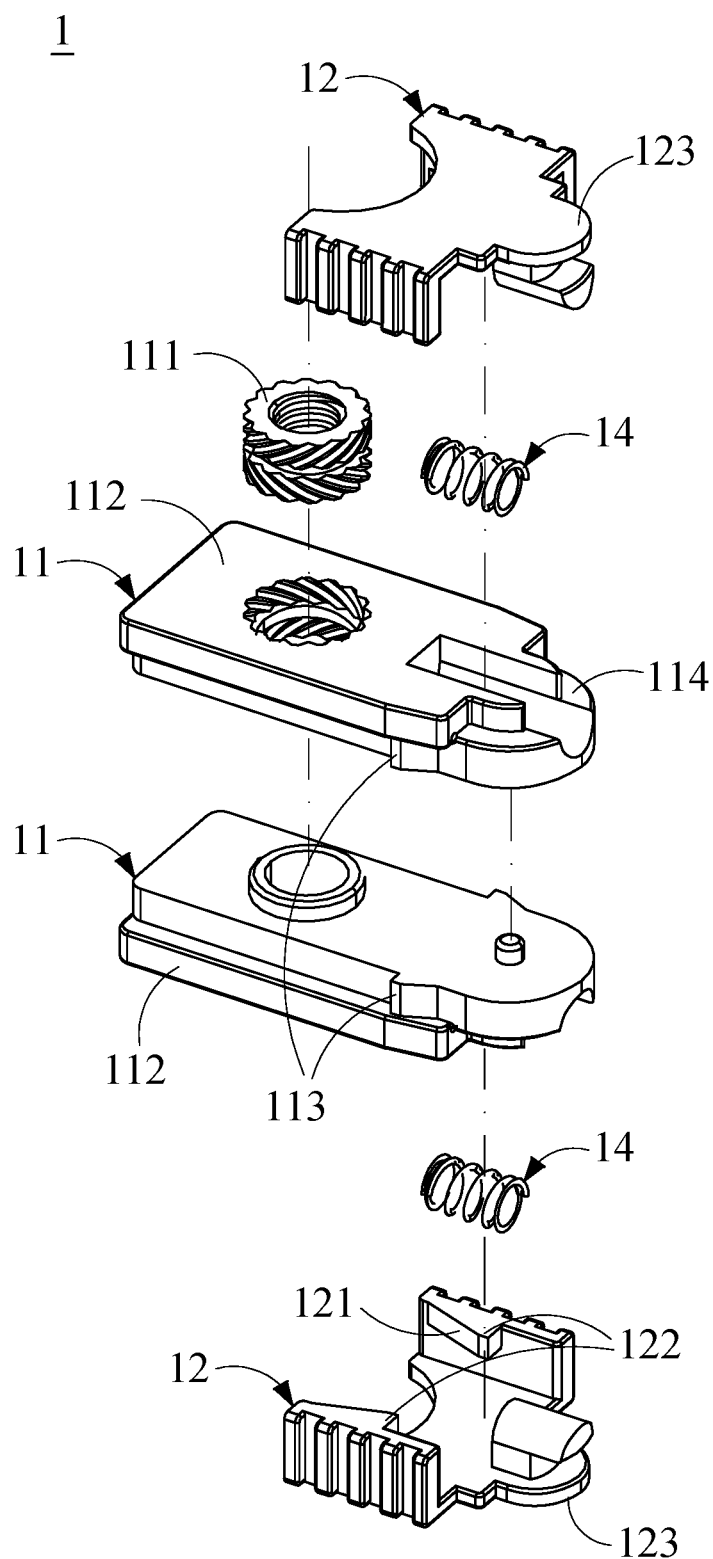
FIG. 25 is an exploded view of the fastening device of FIG. 24.
Figure 26:
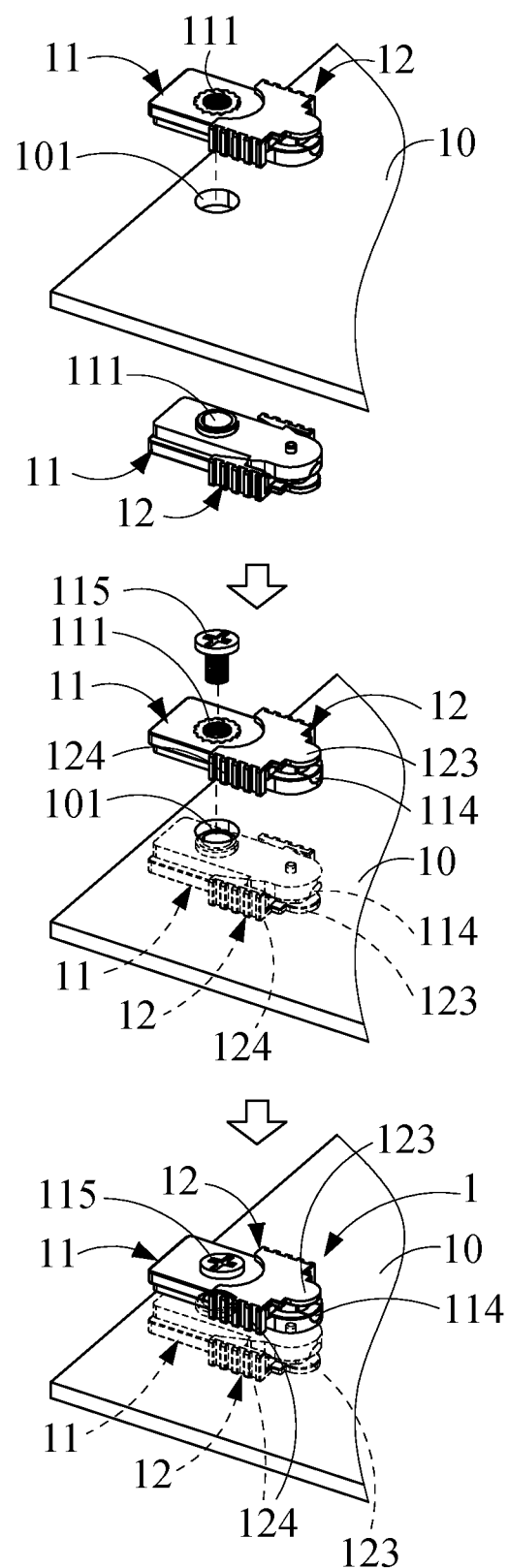
FIG. 26 shows the use of the fastening device according to the seventh embodiment of the present disclosure.

Please refer to FIGS. 24 to 26, in which a fastening device 1 according to a seventh embodiment of the present disclosure is shown. The seventh embodiment is different from the sixth one in that the fastening device 1 includes two base portions 11 and two fastener portions 12. The two fastener portions 12 are respectively slidably assembled to the base portions 11 while the base portions 11 are connected to each other at their bottoms. The base portions 11 respectively have a connecting section 111. A fastening element 115 can be engaged with the connecting sections 111 to set the two base portions 11 to two opposite sides of a first object 10. The base portions 11 further respectively include a resting section 114 and the fastener portions 12 respectively include a fixing section 123. The fixing sections 123 of the fastener portions 12 are located corresponding to the resting sections 114 of the base portions 11, such that the fixing sections 123 of the fastener portions 12 cooperate with the resting sections 114 of the base portions 11 to provide a locking and an unlocking function. Further, the base portions 11 are respectively provided at two lateral sides with a slide section 112 each, and the fastener portions 12 are respectively provided at two lateral sides with a corresponding slide section 121 each. The corresponding slide sections 121 are respectively slidably engaged with the slide sections 112, such that the fastener portions 12 are sideward slidably assembled to the base portions 11. The base portions 11 are also respectively provided at two lateral sides with a stop section 113 each, and the fastener portions 12 are respectively provided at two lateral sides with a corresponding stop section 122 each. The corresponding stop sections 122 are respectively detachably abutted on the stop sections 113, such that the mutually abutted stop sections 113 and corresponding stop sections 122 stop the fastener portions 12 having moved into the locking position from moving relative to the base portions 11. Further, an elastic element 14 is disposed between each base portion 1 and its corresponding fastener portion 12. The elastic elements 14 respectively have an end pressed against the base portion 11 and another end pressed against the fastener portion 12, so that the fastener portions 12 are normally pushed by the elastic elements 14 to the locking position. Alternatively, in another operable embodiment, the fastener portions 12 are normally pushed by the elastic elements 14 to the unlocking position.

To use the fastening device 1 of the seventh embodiment, the connecting sections 111 of the base portions 11 can be aligned with a mounting hole 101 provided on the first object 10 and then thread the fastening element 115 into the connecting sections 111 of the two base portions 11, such that the base portions 11 are connected to the first object 10 with the two fastener portions 12 located above and below the first object 10, respectively.

When using the fastening device 1, first apply a force to the operating sections 124 to sideward slide the fastener portions 12 toward the second end of the base portions 11. When the fastener portions 12 are sideward sliding on and relative to the base portions 11, the corresponding slide sections 121 engage with the slide sections 112 to enable smooth sliding of the fastener portions 12. At this point, the elastic elements 14 are compressed. Then, place a second object and a third object (not shown) on the resting sections 114 of the two base portions 11, respectively, with the fixing sections 123 of the fastener portions 12 directing toward the second and the third object. Thereafter, release the fastener portions 12. At this point, the elastic elements 14 release their elasticity to sideward move the fixing sections 123 of the fastener portions 12 toward the second and the third object until the corresponding stop sections 122 of the fastener portions 12 and the stop sections 113 of the base portions 11 are abutted on one another. At this point, the fastener portions 12 are in a locking position to limit the second and the third object from moving relative to the base portions 11 to complete the locking of the second and the third object to the base portions 11.

When it is desired to remove the second and the third object, simply sideward slide the fastener portions 12 toward the second end of the base portions 11 again. At this point, the elastic elements 14 are compressed, and the fixing sections 123 of the fastener portions 12 are moved to the unlocking position to unlock the second and the third object, allowing the second and the third object to be removed from the resting sections 114 of the base portions 11. After the second and the third object have been removed, the fastener portions 12 are released and the elastic elements 14 release their elasticity to automatically push the fastener portions 12 to the locking position again for use next time. At this point, the disconnection of the base portions 11 from the second and the third object is completed.

Figure 27:
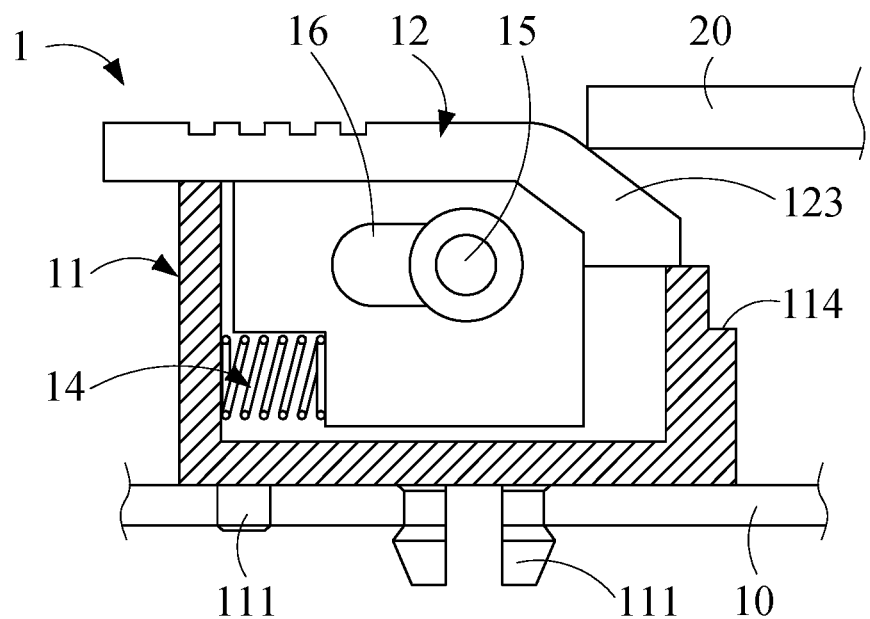
FIG. 27 is a first view showing the use of a fastening device according to an eighth embodiment of the present disclosure.
Figure 28:
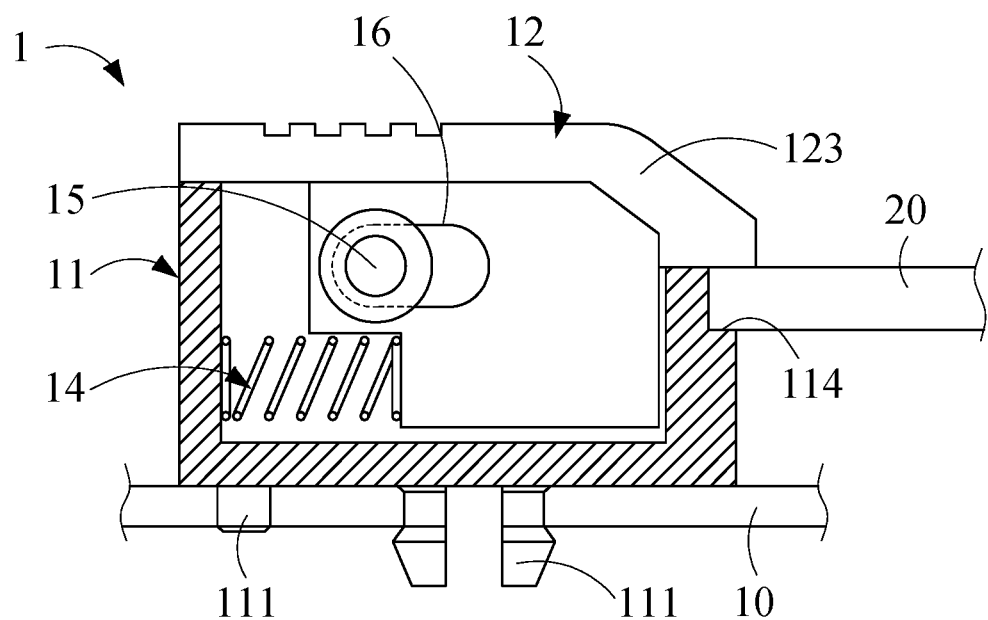
FIG. 28 is a second view showing the use of the fastening device according to the eighth embodiment of the present disclosure.

Please refer to FIGS. 27 and 18, in which a fastening device 1 according to an eighth embodiment of the present disclosure is shown. The eighth embodiment is different from the third, the fourth and the fifth embodiment in that the base portion 11 and the fastener portion 12 of the fastening device 1 of the eighth embodiment are differently configured. However, the fastening device 1 of the eighth embodiment also includes the connecting sections 111, the pin element 15 and the movement section 16. To use the fastening device 1, first correspondingly connect the connecting sections 111 of the base portions 11 to the first object 10 and then place the second object 20 on the resting section 114 of the base portion 11 and let the fixing section 123 of the fastener portion 12 direct toward the second object 20. Thereafter, let the elastic element 14 to release its elasticity, which pushes the fixing section 123 of the fastener portion 12 to move sideward to the locking position and accordingly limit the second object 20 to the resting section 114 of the base portion 11 and achieve the connection of the base portion 12 to the second object 20. In summary, the fastener portion 12 can be slid on the base portion 11 between a locking position and an unlocking position to thereby connect or disconnect the second object 20 to or from the base portion 11.

Figure 29:
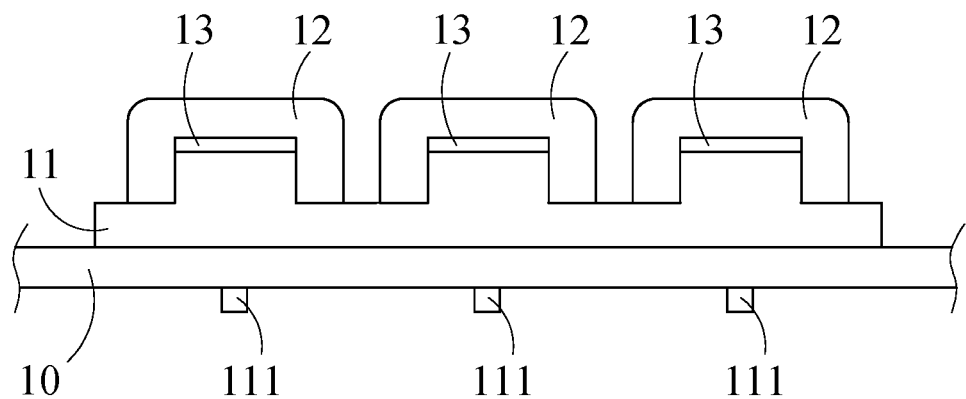
FIG. 29 shows the use of a fastening device according to a ninth embodiment of the present disclosure.

Please refer to FIG. 29, in which a fastening device according to a ninth embodiment of the present disclosure is shown. Unlike the first to the fifth embodiments, the ninth embodiment includes two or more fastener portions 12 that are parallelly arranged on one base portion 11. Alternatively, in an operable variation of the ninth embodiment, the two or more fastener portions 12 are vertically superimposed on the base portion 11 (not shown).

Figure 30:
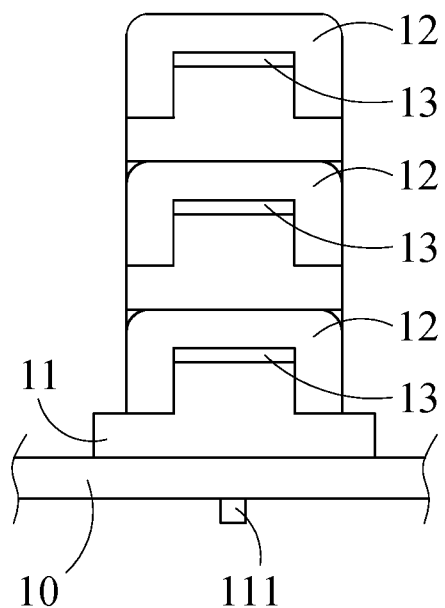
FIG. 30 is a first view showing the use of a fastening device according to a tenth embodiment of the present disclosure.
Figure 31:
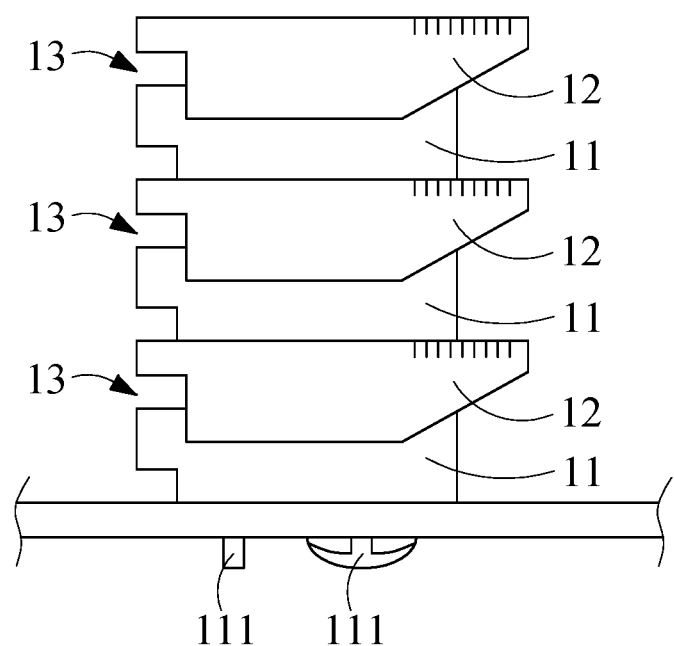
FIG. 31 is a second view showing the use of the fastening device according to the tenth embodiment of the present disclosure.

Please refer to FIGS. 30 and 31, in which a fastening device according to a tenth embodiment of the present disclosure is shown. In the tenth embodiment, the fastening device includes two or more base portions 11 and two or more fastener portions 12. The fastener portions 12 and the base portions 11 are superimposed alternately while the fastener portions 12 are respectively slidably assembled to one base portion 11. In a variation of the tenth embodiment, both of the base portions 11 and the fastener portions 12 are horizontally arranged side by side while the fastener portions 12 are respectively slidably assembled to one base portion 11 (not shown).

In summary, the fastening device according to the present disclosure includes a base portion connected to a first object and a fastener portion capable of locking or unlocking a second object to or from the base portion, so that two objects can be quickly and repeatedly connected to or disconnected from one another.

While the present disclosure has been described by means of some specific embodiments, numerous modifications and variations could be made thereto by those skilled in the art without departing from the scope and spirit of the present disclosure set forth in the claims.

What is claimed is:

1. A fastening device, being characterized in comprising:
   at least one base portion for connecting to a first object; and
   at least one fastener portion being slidably assembled to the base portion, such that the fastener portion cooperates with the base portion to provide a locking and an unlocking function for connecting or disconnecting a second object to or from the base portion;
   wherein the base portion is provided at two lateral sides with a stop section each, and the fastener portion is provided at two lateral sides with a corresponding stop section each; and the corresponding stop sections being respectively detachably abutted on the stop sections, such that the mutually abutted stop sections and corresponding stop sections stop the fastener portion having locked the second object in place from moving relative to the base portion.

2. The fastening device according to claim 1, characterized in that the base portion including at least one limiting body and the first object including a limiting slot; the limiting slot having at least one retaining section, and the limiting body being abutted on the retaining section, such that the base portion is connected to the first object.

3. The fastening device according to claim 1, characterized in that the base portion is provided at two lateral sides with a slide section each, and the fastener portion is provided at two lateral sides with a corresponding slide section each; and the corresponding slide sections being slidably engaged with the slide sections, such that the fastener portion is sideward slidably assembled to the base portion.

4. The fastening device according to claim 1, characterized in that the base portion is provided at an end with a resting section and the fastener portion is provided at an end with a fixing section; the fixing section being located corresponding to the resting section, such that the fixing section of the fastener portion cooperates with the resting section of the base portion to provide the locking and the unlocking function to connect or disconnect the second object to or from the base portion.

5. The fastening device according to claim 1, characterized in that the base portion and the fastener portion have an elastic element disposed between them; the elastic element having an end pressed against the base portion and another end pressed against the fastener portion, such that the fastener portion is normally pushed by the elastic element to a locking position or an unlocking position.

6. The fastening device according to claim 1, characterized in that the base portion and the fastener portion have a pin element disposed between them; the pin element being provided on the base portion and the fastener portion including a movement section that is movably connected to the pin element, such that the fastener portion is movably assembled to the base portion.

7. The fastening device according to claim 1, characterized in that the first object connected to the fastening device is a printed circuit board (PCB).

8. A fastening device, being characterized in comprising:
at least one base portion for connecting to a first object; and
at least one fastener portion being slidably assembled to the base portion, such that the fastener portion cooperates with the base portion to provide a locking and an unlocking function for connecting or disconnecting a second object to or from the base portion;
wherein the fastening device includes two or more fastener portions, and the fastener portions can be slidably assembled to the base portion in different ways, including being slidably assembled to a top and a bottom of the base portion, being parallelly arranged on and slidably assembled to the base portion, or being vertically superimposed on and slidably assembled to the base portion.

9. The fastening device according to claim 8, characterized in that the base portion is provided with a resting section and the fastener portions are respectively provided with a fixing section; and the resting section being located corresponding to the fixing sections, such that the fixing sections of the fastener portions cooperate with the resting section of the base portion to provide the locking and the unlock function.

10. The fastening device according to claim 8, characterized in that the base portion is provided with slide sections and the fastener portions are respectively provided with corresponding slide sections; and the corresponding slide sections being slidably engaged with the slide sections, such that the fastener portions are sideward slidably assembled to the base portion.

11. The fastening device according to claim 8, characterized in that the base portion is provided with stop sections and the fastener portions are respectively provided with corresponding stop sections; and the corresponding stop sections being respectively detachably abutted on the stop sections, such that the mutually abutted stop sections and corresponding stop sections stop the fastener portions having locked the second objects in place from moving relative to the base portion.

12. The fastening device according to claim 11, characterized in that either the stop sections or the corresponding stop sections are flexible for snap-fitting; and the stop sections or the corresponding stop sections being respectively provided with a beveled surface or a curved surface, such that the stop sections and the corresponding stop sections are slidably interlocked with one another.

13. The fastening device according to claim 11, characterized in that either the stop sections or the corresponding stop sections are flexible for snap-fitting; and the stop sections or the corresponding stop sections being respectively provided with a beveled slide surface or a curved slide surface, such that the stop sections and the corresponding stop sections are slidable relative to one another; and a portion of each of the stop sections or of the corresponding stop sections located immediately opposed to the slide surface being an abutting surface that defines a right angle, a near-right angle, or an angle larger than that defined by the slide surface to facilitate stable interlocking of the stop section to the corresponding stop section.

14. The fastening device according to claim 11, characterized in that the base portion and each of the fastener portions have an elastic element disposed between them; the elastic elements respectively having an end pressed against the base portion and another end pressed against the fastener portion, such that the fastener portions are normally pushed by the elastic elements to a locking position or an unlocking position.

15. A fastening device, being characterized in comprising:
at least one base portion for connecting to a first object; and
at least one fastener portion being slidably assembled to the base portion, such that the fastener portion cooperates with the base portion to provide a locking and an unlocking function for connecting or disconnecting a second object to or from the base portion;
wherein the fastening device includes two or more base portions and two or more fastener portions, and the fastener portions can be correspondingly slidably assembled to the base portions; the base portions being connected to one another at their bottoms, and the fastener portions being parallelly arranged on the base portions or being vertically superimposed on the base portions.

16. The fastening device according to claim 15, characterized in that the base portions are respectively provided with a resting section and the fastener portions are respectively provided with a fixing section; and the resting sections being located corresponding to the fixing sections, such that the fixing sections of the fastener portions cooperate with the resting sections of the base portions to provide the locking and the unlock function.

17. The fastening device according to claim 15, characterized in that the base portions are respectively provided with slide sections and the fastener portions are respectively provided with corresponding slide sections; and the corresponding slide sections being slidably engaged with the slide sections, such that the fastener portions are respectively sideward slidably assembled to the base portions.

18. The fastening device according to claim 15, characterized in that the base portions are respectively provided with stop sections and the fastener portions are respectively provided with corresponding stop sections; and the corresponding stop sections being respectively detachably abutted on the stop sections, such that the mutually abutted stop sections and corresponding stop sections stop the fastener portions having locked the second objects in place from moving relative to the base portions.

19. The fastening device according to claim 15, characterized in that each of the base portions and the corresponding one of the fastener portions have an elastic element disposed between them; the elastic elements respectively having an end pressed against the base portion and another end pressed against the fastener portion, such that the fastener portions are normally pushed by the elastic elements to a locking position or an unlocking position.

* * * * *